United States Patent [19]

Sleeth et al.

[11] Patent Number: 4,481,481

[45] Date of Patent: Nov. 6, 1984

[54] BUFFER INVERTER CIRCUIT WITH ADAPTIVE BIAS

[75] Inventors: Robert S. Sleeth, Santa Clara; Dennis M. Monticelli, Fremont, both of Calif.

[73] Assignee: National Semiconductor Corporation, Santa Clara, Calif.

[21] Appl. No.: 465,721

[22] Filed: Feb. 11, 1983

[51] Int. Cl.³ .............................................. H03F 3/04
[52] U.S. Cl. .................................... 330/296; 330/288
[58] Field of Search ................ 330/288, 296; 323/315, 323/316

[56] References Cited

U.S. PATENT DOCUMENTS 4,371,792 2/1983 Dobkin ............................... 330/288

Primary Examiner—James B. Mullins
Assistant Examiner—G. Wan
Attorney, Agent, or Firm—Gail W. Woodward; Paul J. Winters; Michael J. Pollock

[57] ABSTRACT

An integrated circuit buffer inverter is created by cascading an emitter follower stage with a common emitter stage. Both stages include constant collector current loads. The emitter follower stage is adaptively biased from a current mirror that is driven from the collector of the emitter follower for the purpose of maximizing bipolar drive to the common emitter stage.

8 Claims, 2 Drawing Figures

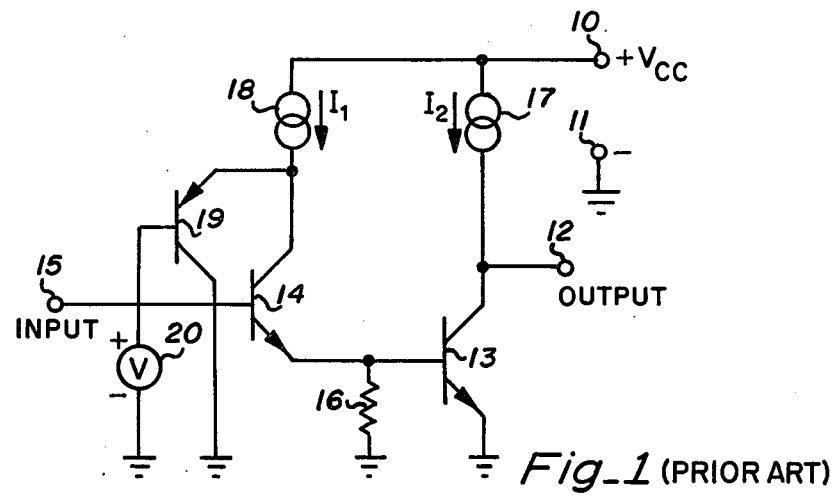
*Fig_1* (PRIOR ART)
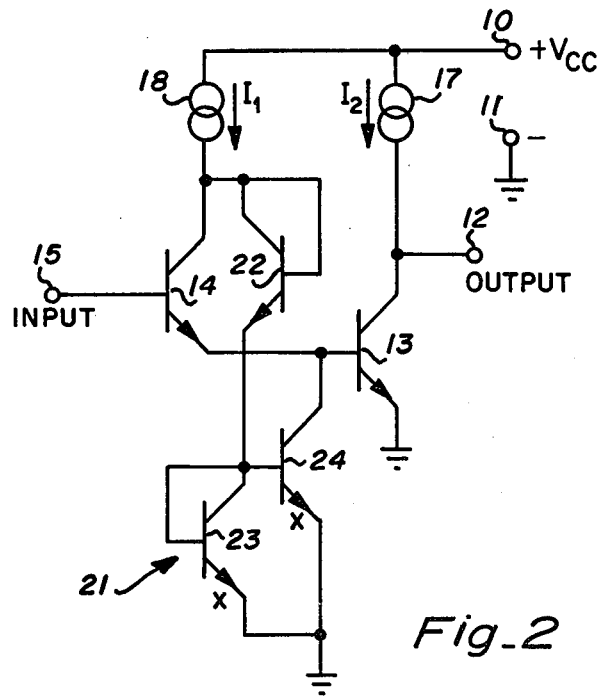
*Fig_2*

BUFFER INVERTER CIRCUIT WITH ADAPTIVE BIAS

BACKGROUND OF THE INVENTION

The invention relates to linear integrated circuit (IC) structures. Where a circuit function requires a buffer amplifier having high voltage gain and high input impedance, a combination of a common emitter stage driven from an emitter follower stage is employed. This conventional configuration when implemented in the usual way has several drawbacks. The common emitter transistor ordinarily has its base returned to its emitter by way of a resistor. If the resistor value is increased its pull down capability is compromised. If it is made too small the input stage drive capability is compromised. Thus, the resistor value must be selected as a trade off between the available drive and the output stage base pull down.

SUMMARY OF THE INVENTION

It is an object of the invention to provide a buffer inverter amplifier in which the input stage adapts its operating level according to the level of conduction of the output stage.

It is a further object of the invention to bias an emitter follower, driver stage as a function of the current in a common emitter output stage so that the available drive (both sink and source) to the output stage is maximized.

These and other objects are achieved in a circuit configured as follows. A common emitter output transistor stage has its collector returned to the supply by means of a constant current drive so as to achieve high voltage gain. Its base is driven from an emitter follower to provide a high input impedance. The emitter follower has a constant current device coupled in series between its collector and the supply. The collector of the emitter follower is diode coupled to a current mirror input, the output of which is coupled to the base of the common emitter output stage. If the current mirror has unity gain the circuit threshold voltage is 2 $V_{BE}$ and the emitter follower collector is clamped at 2 $V_{BE}$. The output stage maximum base current drive, as well as the maximum base current pulldown, is equal to the current value of the device in the collector of the emitter follower. Since there is no pull down resistor there is no design compromise.

BRIEF DESCRIPTION OF THE DRAWING

FIG. 1 is a schematic diagram of the prior art circuit.
FIG. 2 is a schematic diagram of the circuit of the invention.

DESCRIPTION OF THE PRIOR ART

In the schematic diagram of FIG. 1 a common inverting amplifier buffer is shown. The circuit operates from a $V_{CC}$ power supply connected + to terminal 10 and − to ground terminal 11. The output at terminal 12 is taken from common emitter transistor 13. Emitter follower transistor 14, which operates at high input impedance, is used to drive the base of transistor 13 and is in turn driven from input terminal 15. Resistor 16 returns the base of transistor 13 to its emitter and acts as a pull down element. Current source 17 supplies $I_2$ to the collector of transistor 13 thus making it a high gain inverting amplifier stage.

Current source 18 supplies $I_1$ to the collector of emitter follower transistor 14. When transistor 14 is biased full on its maximum current is $I_1$ which flows in part into the base of transistor 13. The remainder flows in resistor 16. The base drive $I_{BMAX}=I_1-(V_{BE13}/R_{16})$ where $V_{BE13}$ is the base to emitter voltage of transistor 13 and $R_{16}$ is the resistance of resistor 16. Thus the current flowing in resistor 16 is parasitic in that it does not contribute to the base drive. When transistor 14 is turned off resistor 16 will pull the base of transistor 13 low so as to turn it off and the maximum pull down current, $I_{PD}=(V_{BE13}/R_{16})$. It can be seen that in order to enhance pull down resistor 16 should be made as small as possible but this increases the parasitic part of the base drive current for turn on. Therefore, the value of resistor 16 must be a compromise.

Transistor 19 is an optional device which when used requires a voltage source 20 to operate. If transistor 14 is turned off or conducts less than $I_1$ without transistor 19, source 18 will go into saturation which can create problems for the bias circuitry of source 18. Transistor 19 prevents this by providing an alternate path for $I_1$ when transistor 14 is off. Voltage source 20 provides a $V_{BE}$ of the base of transistor 19 so that its emitter will clamp the collector of transistor 14 at 2 $V_{BE}$. Thus, when transistor 14 is off its collector will rise only to 2 $V_{BE}$ and $I_1$ is shunted to ground so that source 18 will not saturate.

DESCRIPTION OF THE INVENTION

FIG. 2 is a schematic diagram of the circuit of the invention. Where the elements are the same as those of FIG. 1 the same numbers are used.

The output stage, which is common emitter transistor 13, with its load 17, is the same as FIG. 1 and is driven by emitter follower transistor 14. Resistor 16 has been eliminated and replaced by current mirror 21. The current mirror input is coupled via diode 22 to the collector of transistor 14. Current mirror 21 is composed of diode connected transistor 23 and transistor 24. In the preferred embodiment the size of diode 23 is made equal to the size of transistor 24 so that the current mirror has unity gain. Under this condition the circuit threshold is set at the input condition where transistor 14 conducts $I_1$. The same current will flow in diodes 22 and 23 and hence in transistor 24. This means that zero current is available for the base of transistor 13. If the input at terminal 15 rises, reflecting an increase in the conduction of transistor 13 due to loading at terminal 12, the conduction of transistor 14 increases so that less current will flow in diodes 22 and 23 and hence transistor 24. The difference will then be forced into the base of transistor 13. The maximum drive current will be $I_1$ which will be invoked when transistor 14 is sufficiently conductive to overwhelm any conduction in transistor 24. On the other hand when the potential at terminal 15 drops to where transistor 14 is turned off, $I_1$ will flow in diodes 22 and 23. First the diodes will clamp the potential at the collector of transistor 14 to 2 $V_{BE}$ and at the same time transistor 24 will pull the base of transistor 13 down with a drive capability of $I_1$. It can be seen that the drive to transistor 13 is greater for both pull up and pull down than it was for FIG. 1. Furthermore, the circuit provides clamping so that source 18 cannot saturate. The threshold at terminal 15 for conduction in transistor 13 is set by the current mirror ratio. For example, with the unity gain preferred, the conduction threshold is close to 2 $V_{BE}$ as described above. If the mirror is made to have current gain the threshold is raised and with a current loss, or attenuation, the threshold is lowered. This means that the threshold can be independently selected by means of a geometry control. In the prior art circuit the threshold can be varied by varying the value of resistor 16, but its value is already a compromise that is determined by other considerations.

The invention has been described and its relationship to the prior art detailed. When a person skilled in the art needs the foregoing, alternatives and equivalents, within the spirit and intent of the invention, will be apparent. Accordingly, it is intended that the scope of the invention be limited only by the claims that follow.

We claim:

1. An inverting buffer amplifier circuit having input and output terminals, said circuit comprising
   a common emitter output stage driving said output terminal;
   an emitter follower input stage driven from said input terminal and driving the base of said output stage, said emitter follower including a means for sourcing current in series with its collector; and
   a current mirror having an input coupled to be driven from said collector of said emitter follower and an output coupled to said base of said output stage.

2. The circuit of claim 1 wherein said current mirror has unity current gain.

3. The circuit of claim 1 wherein said current mirror input is coupled to said collector of said emitter follower by means of a forward biased diode.

4. An inverting buffer amplifier circuit having input and output terminals, said circuit comprising:
   first and second supply rails connectable to a source of operating potential;
   first transistor means having an emitter coupled to said second supply rail, a collector coupled to said output terminal and a base;
   second transistor means having an emitter coupled to said base of said first transistor means, a base coupled to said input terminal and a collector;
   first constant current means couple between said first supply rail and said collector of said first transistor means;
   second constant current means coupled between and first supply rail and said collector of said second transistor means; and
   current mirror means having an input coupled to said collector of said second transistor means and an output coupled to said base of said first transistor means.

5. The circuit of claim 4 wherein said current mirror input is coupled to said collector of said second transistor means by first forward biased diode means.

6. The circuit of claim 5 wherein said first forward biased diode means is created from a fourth transistor means having a base returned to its collector.

7. The circuit of claim 4 wherein said current mirror means comprise:
   third transistor means having an emitter coupled to said first supply rail a collector that constitutes said current mirror output and a base; and second diode means, poled for forward conduction, coupled between said base and emitter of said third transistor means.

8. The circuit of claim 7 wherein said second diode means is created from fifth transistor means having a base returned to its collector.

* * * * *